United States Patent
Ansari

[19]

[11] Patent Number: 6,163,866
[45] Date of Patent: Dec. 19, 2000

[54] SYSTEM LEVEL IC TESTING ARRANGEMENT AND METHOD

[75] Inventor: Shahid S. Ansari, Milpitas, Calif.

[73] Assignee: Sun Microsystems, Inc., Palo Alto, Calif.

[21] Appl. No.: 08/282,913

[22] Filed: Jul. 29, 1994

[51] Int. Cl.[7] .................................................. G01R 31/28
[52] U.S. Cl. ............................................................. 714/734
[58] Field of Search ........................... 324/158 R, 158 P, 324/750; 371/22.6; 156/643; 714/734, 724, 735, 738, 742, 25, 26, 32, 41; 250/309

[56] References Cited

U.S. PATENT DOCUMENTS

| | | | |
|---|---|---|---|
| 4,862,075 | 8/1989 | Choi et al. | 324/158 |
| 4,980,019 | 12/1990 | Baerg et al. | 156/643 |
| 5,162,728 | 11/1992 | Hupenthal | 324/158 R |
| 5,177,437 | 1/1993 | Henley | 324/158 |
| 5,179,279 | 1/1993 | Millard et al. | 250/309 |
| 5,475,316 | 12/1995 | Hurley et al. | 324/750 |

*Primary Examiner*—Nadeem Iqbal
*Attorney, Agent, or Firm*—Beyer Weaver & Thomas, LLP

[57] ABSTRACT

A method and apparatus for testing an integrated circuit in a system level environment such that the integrated circuit to be tested is wired into a system or module when the testing occurs is disclosed. In one embodiment of a method aspect of the invention, a die in a packaged integrated circuit to be tested is exposed. A module that incorporates the exposed die is placed on a test platform. The test platform and a sensor probe are relatively positioned such that the sensor probe can directly monitor the exposed die during testing. The positioning may be accomplished by moving the test platform, the sensor probe or both. The system is then driven in a manner which exercises the exposed die. The sensor probe then directly monitor the die while the exposed die is being exercised. The die can be exposed in a variety of manners as for example by removing a package cover or by etching portions of the plastic packaging material. An integrated circuit tester suitable for implementing this process is also disclosed as well as a test board suitable for use when the integrated circuits being tested are cavity down packaged integrated circuits.

21 Claims, 6 Drawing Sheets

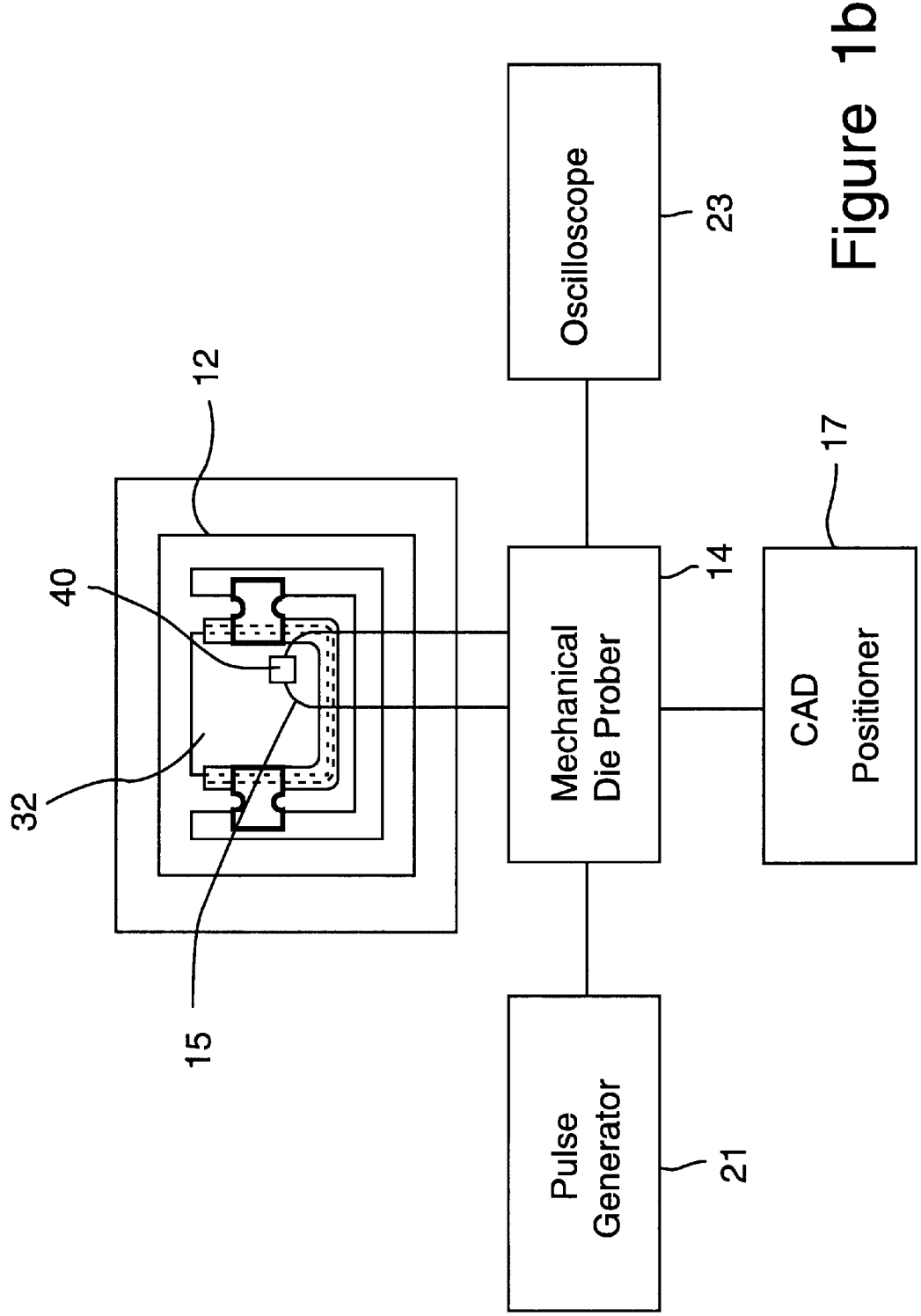

SYSTEM LEVEL IC TESTING ARRANGEMENT AND METHOD

BACKGROUND OF THE INVENTION

The present invention relates generally to integrated circuit testers and methods for testing the performance of specific integrated circuits in a system level environment. More particularly, a tester arrangement that permits probing and other die level testing of an integrated circuit while it is connected and operated in a board level system is disclosed.

When debugging computer systems, a test engineer typically first attempts to determine the failing device. Once the failing device has been identified, the device is tested in order to determine exactly what is causing the fault. When integrated circuits are at fault, one common test approach is to remove the fault generating part from the system and invasively test it on an automatic tester of the type that are commercially available from a variety of vendors. Dedicated test software is then often written in order to exercise the faulty device in a manner which stimulates the failing pattern observed at a system level. Often, the writing of the test software is quite slow and time consuming. Further, in many cases it is difficult to recreate failures observed at the system level in integrated circuits that are tested independently of the system. Thus, it would be desirable to have a test system which accommodates testing faulty integrated circuits on a system level in order to permit more realistic duplication of the observed failure pattern during testing. Accordingly

SUMMARY OF THE INVENTION

To achieve the foregoing and other objects and in accordance with the purpose of the present invention, a method and apparatus for testing an integrated circuit in a system level environment such that the integrated circuit to be tested is wired into a system or module when the testing occurs is disclosed. In one embodiment of a method aspect of the invention, a die in a packaged integrated circuit to be tested is exposed. A module that incorporates the exposed die is placed on a test platform. The test platform and a sensor probe are relatively positioned such that the sensor probe can directly monitor the exposed die during testing. The positioning may be accomplished by moving the test platform, the sensor probe or both. The system is then driven in a manner which exercises the exposed die. The sensor probe then directly monitor the die while the exposed die is being exercised. The die can be exposed in a variety of manners as for example by removing a package cover or by etching portions of the plastic packaging material.

The described method can be used to monitor a variety of integrated circuits and the module mounted on the test platform may be a main board, a peripheral board or any other type of module. In some embodiments, in which the module is a plug-in board for a larger system that is not suitable for mounting on the test platform, the module can be supported by the test platform and connection wiring can be used to couple the module into the system. The invention can be used with a wide variety of analysis equipment, as for example, die probers, emissions microscope, electron beam (E-beam) probes and infra-red (IR) cameras.

In an apparatus aspect of the invention, an integrated circuit tester system is disclosed. In one embodiment the integrated circuit tester system includes a test platform arranged to support a module that carries for multiplicity of electrically connected components that make up at least a part of an electrical system. A sensor probe for directly interrogating a designated exposed integrated circuit die that is mounted on and electrically connected within said printed circuit board and which forms a component in the system is also provided. In another embodiment a driver suitable for directing the operation of the system in a manner that exercises the designated die to facilitate testing is also provide.

In yet another aspect of the invention, a test board suitable for use when the integrated circuits being tested are cavity down integrated circuits is described. The test board takes the form of a printed circuit board suitable for supporting a multiplicity of components. The printed circuit board includes a multiplicity of traces for electrically connecting various components and a prober testing opening. A multiplicity of components are mounted on the printed circuit board. The components include an integrated circuit on a silicon die that is mounted over the prober testing opening such that a sensor probe can access the die through said prober testing opening when the die is exposed.

In one embodiment, the test board further includes a socket for supporting the integrated circuit. The socket includes a central opening positioned over the prober testing opening such that the sensor probe can access the die through said central opening when the die is exposed. In another embodiment, the traces are routed around the prober testing opening.

BRIEF DESCRIPTION OF THE DRAWINGS

The invention, together with further objects and advantages thereof, may best be understood by reference to the following description taken in conjunction with the accompanying drawings in which:

FIG. 1(*b*) is a block diagram of an alternative system die prober testing arrangement suitable for implementing the present invention.

DETAILED DESCRIPTION OF THE INVENTION

Figure 1A:
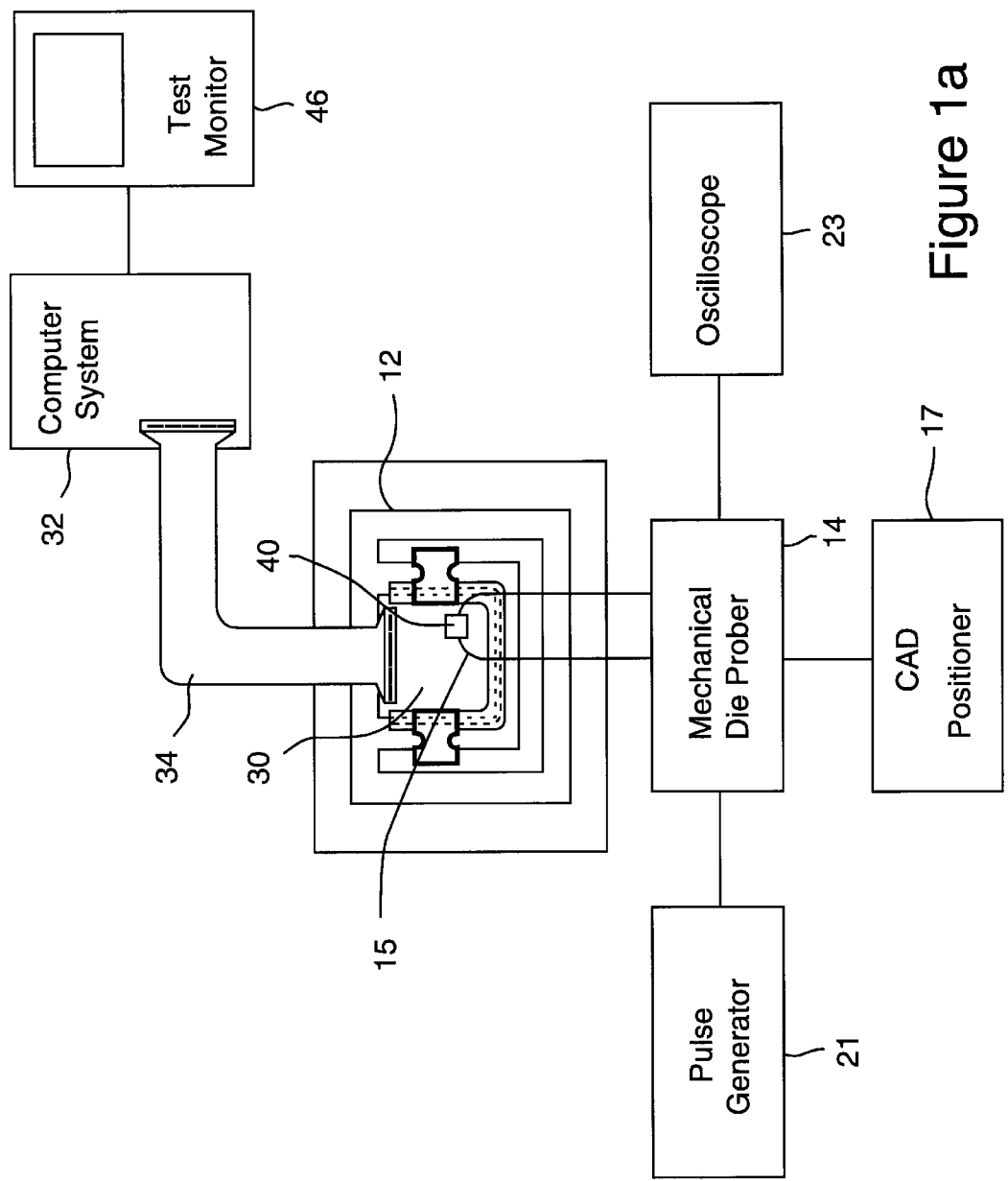
FIG. 1(*a*) is a block diagram of a system die prober testing arrangement suitable for implementing the present invention.

The present invention relates to integrated circuit testers and testing that are arranged to perform die level diagnostics while the integrated circuit (IC) being tested is incorporated into a system level module. An integrated circuit testing arrangement 10 suitable for testing integrated circuits in accordance with the present invention is illustrated in FIG. 1(*a*). A test platform 12 is arranged to support a module 30 which contains the device (IC) under test 40. A sensor probe 15 such as a sub-micron probe of a mechanical die prober 14 is arranged such that it is or can be positioned over the test platform 12. Typically, an automated CAD driven micropositioner 17 is provided to accurately position the probe relative to the device under test. In the embodiment shown, the probe 15 moves in three dimensions to precisely position to a specified location within a die, while the test platform is used for holding and maneuvering the module 30 into a position suitable for probing. In alternative embodiments, the micro-positioning can be accomplished by fine movements of the test platform 12 or both can be moved. In some embodiment, the test probe 15 and the test platform 12 form parts of an integrated circuit debugging system. In others, they may be separate components. A variety of other components may also be provided as part of the integrated circuit debugging system. By way of example, a pulse generator 21 may be provided to directly exercise the die. An oscilloscope 23 is provided to permit the user to monitor the die during system die testing. Of course other components can be used as well, the various components can be either integrated into a single unit or used as separate components.

In the embodiment shown, the module 30 forms a component in a computer system 32 that is mounted on a single printed circuit board that is separate from the main circuit board. Therefore, the module 30 is connected into the computer system 32 via a ribbon cable connector 34. If the die being tested is on the main board of a system, the main board itself can be held by the test platform 12 as illustrated in FIG. 1(*b*). For the best simulation of actual system performance, it is generally preferable to duplicate the actual system as accurately as possible. Therefore, when it is possible to mount the system directly on the test platform 12 in a manner that facilitates testing, that approach is desirable. When such an approach is not practical, then it is generally preferable to have shorter length cable connectors than longer length connectors. This is because although the variations introduced by the cabling (when compared to actual system performance) are small, some variations do occur which could influence the results observed during testing.

In some cases it may be desirable to also include a test monitor 46 that is coupled to the system being tested in order to initialize and/or monitor the tests as illustrated in FIG. 1(*a*). In other situations, it may be possible to initialize the tests using the module being tested in which case the test monitor 46 may be eliminated as illustrated in FIG. 1(*b*).

Figure 2:
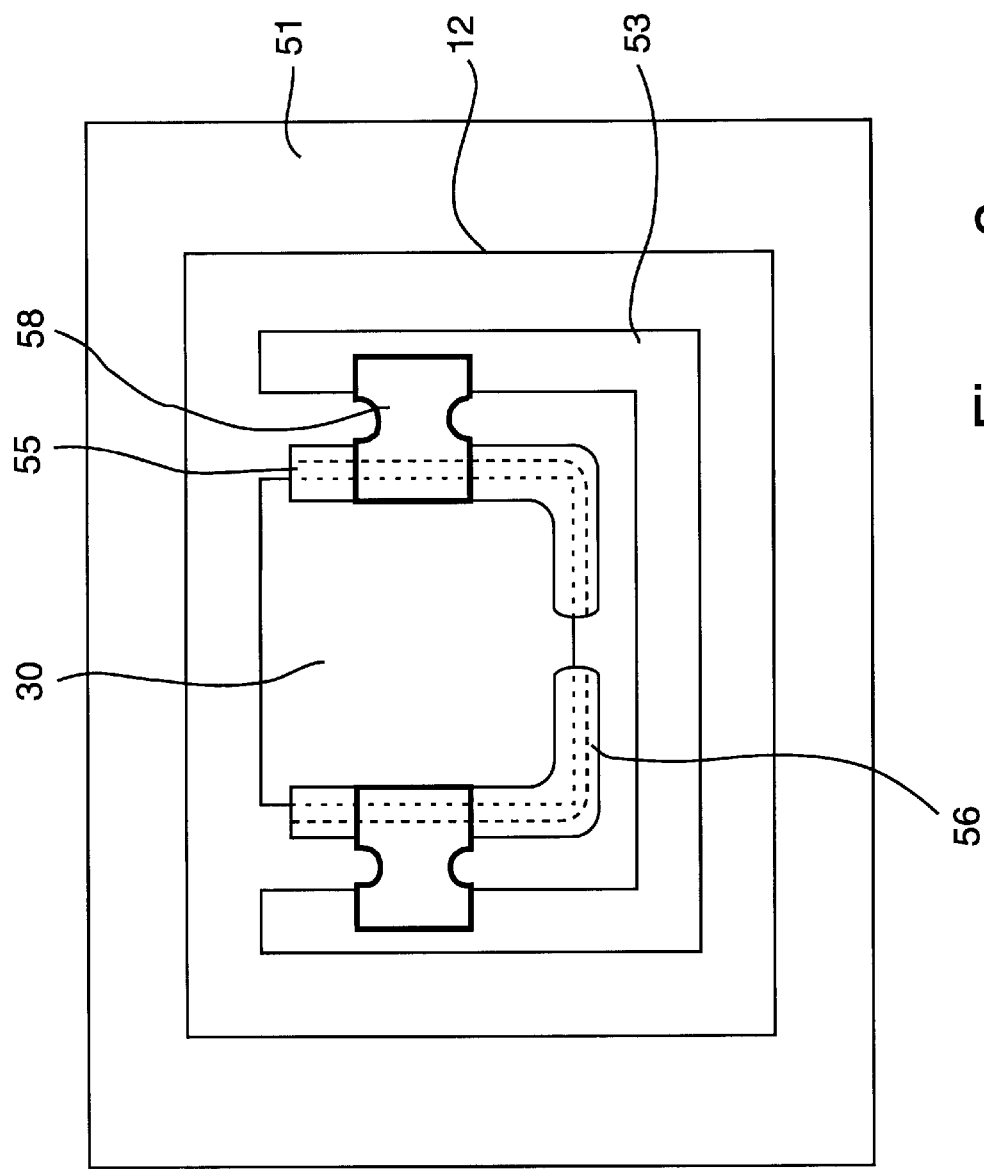
FIG. 2 is a top view of a test platform holding a printed circuit board in a position suitable for probing.

Referring next to FIG. 2, one embodiment of the test platform 12 will be described in somewhat more detail. The test platform 12 is supported on a base 51 by a set of actuators (not shown). The positioning control is accomplished by moving the U-shaped rail within the test platform 12 in the system die prober to align the device under test, and then precisely moving the microprobe 15 to a specific location within the die. A U-shaped mounting bracket 53 is firmly secured to the test platform 12. The mounting bracket 53, in turn firmly supports a U-shaped rail 55 by a pair of laterally adjustable support arms 58. Of course, in alternative embodiments, the collapsible rail 55 can be used to extend and shorten along its base leg 56 in order to support modules having printed circuit boards of varying widths. The width of the base leg 56 of rail 55 can be controlled by adjusting the extension of support arms 58. The rail 55 has a substantially U-shaped cross section that receives the edge of the printed circuit board for the module under test 30.

In applications where the device under test can be directly accessed by the probe unit at the system level, the system can be mounted directly on the micro-positioner table using suitable mounts. The nature of the mounts may vary widely in accordance with the types of systems being tested.

When the integrated circuits to be tested have cavity up, lead down type packages, the top surface of the dies can be readily accessed by opening the top surface of the chip. On the other hand, it is more difficult to access the die in cavity down, lead down type packages since the surface of the integrated circuit that must be accessed is facing the printed circuit board. In integrated circuits that have a hollow shell type package such as a ceramic package, a package cover is often provided which is soldered to the package shell. In such devices, the die can be readily accessed by merely heating the solder and removing the package cover. In plastic encapsulated integrated circuits and the like, forming an opening in the package cover may be required.

Figure 3:
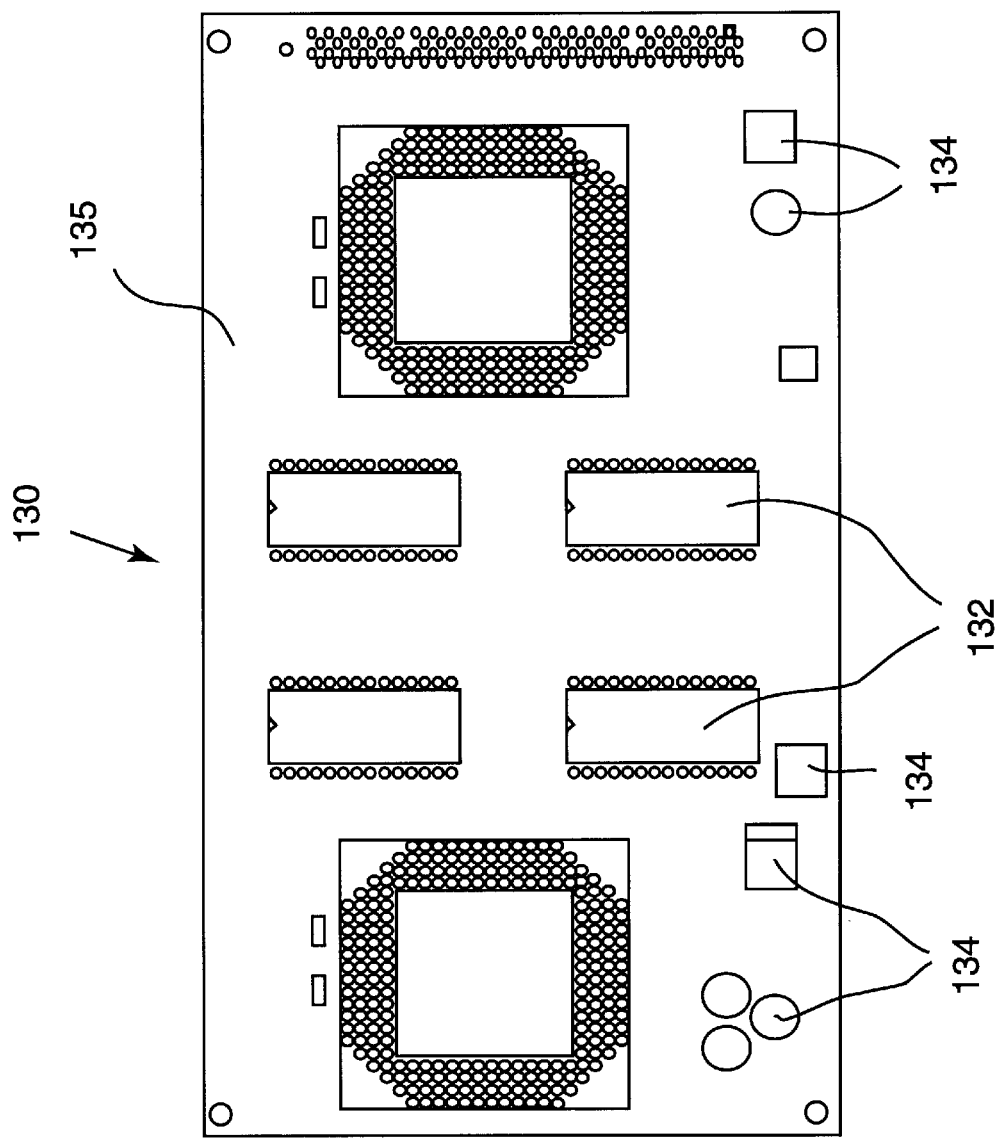
FIG. 3 is a diagrammatic top view of a test version printed circuit board that supports a cavity down, lead down integrated circuit that is well suited for use with the test fixture shown in FIG. 2.
Figure 4:
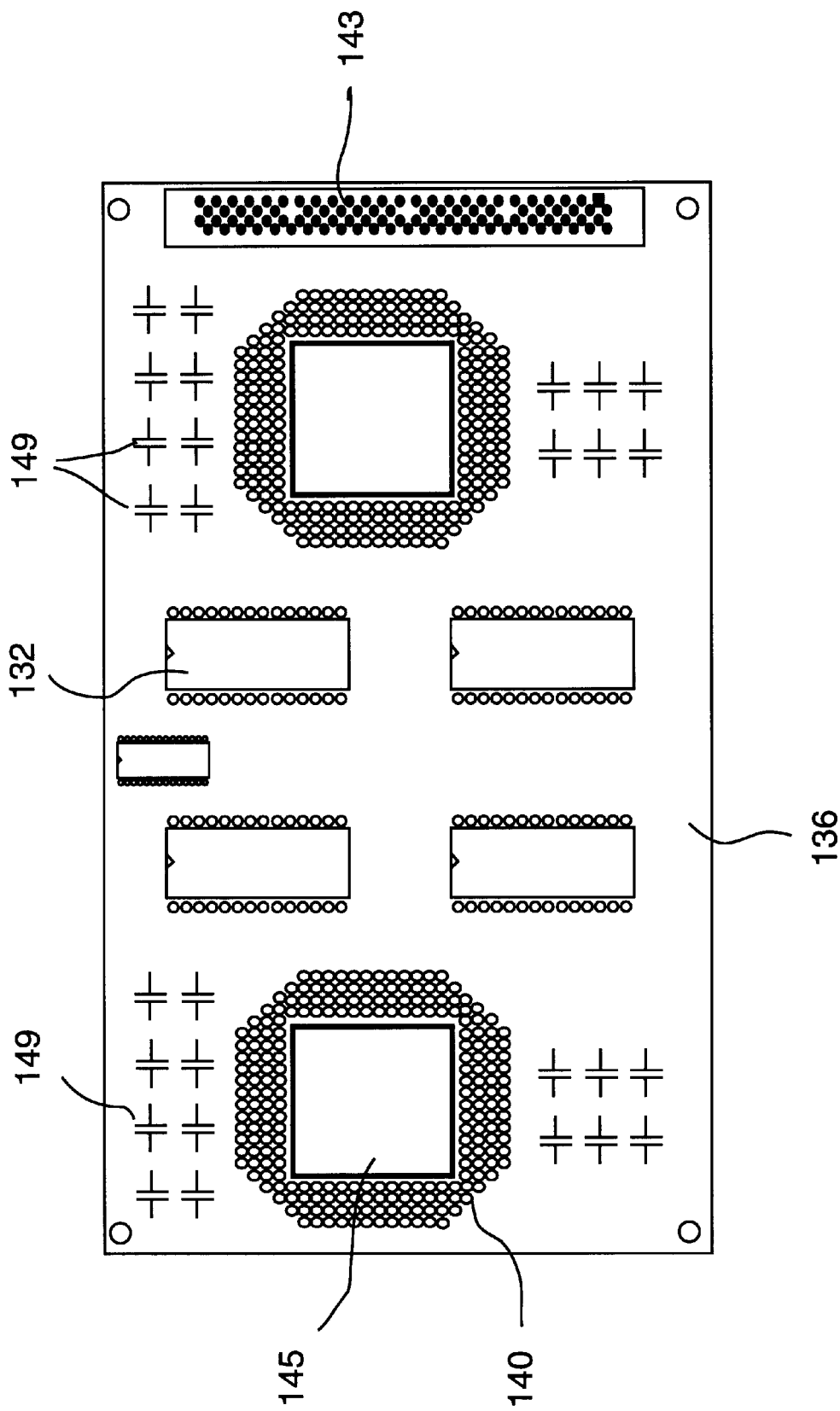
FIG. 4 is a diagrammatic bottom view of the printed circuit board shown in FIG. 3.

Referring next to FIG. 3, a printed circuit board construction that is particularly well suited for permitting access to downward facing dies will be described. The illustrated prototype printed circuit board 130 has a plurality of integrated circuits which include potential devices under test 140 and a variety of other integrated circuits 132. A multiplicity of surface mounted components 134 are mounted on both the top surface 135 and the bottom surface 136 of the printed circuit board 130. The ICs and surface mounted components 134 may be of any type necessary to facilitate the needs of the system carried by the printed circuit board. By way of example, the surface mounted components may take the form of resistors, capacitors, inductors, diodes, oscillators, etc. In the embodiment shown in FIG. 4, the printed circuit board is a plug in card that attaches to a main computer board. Therefore it also includes a connector 143 that plugs into a mating connector on the main computer board. Of course, the number of connectors, surface mounted components, integrated circuits and other devices will vary a great deal in accordance with the needs and purpose of the board.

An enlarged opening 145 is formed in the printed circuit board at a location directly under each potential device under test 140 that has a downward facing die. The number of openings will, of course, vary depending on the number of integrated circuits that the system developer may have an interest in debugging for any particular device. The openings 145 must be large enough such that a sensor probe can access the exposed die through the opening. In the embodiment shown, the openings are square. However, it should be appreciated that the opening geometry may vary a great deal within the scope of the invention.

With advance planning, the printed circuit board 130 may be designed such that it routes all traces outside of the area that is to be cut away when forming the openings 145.

Figure 5:
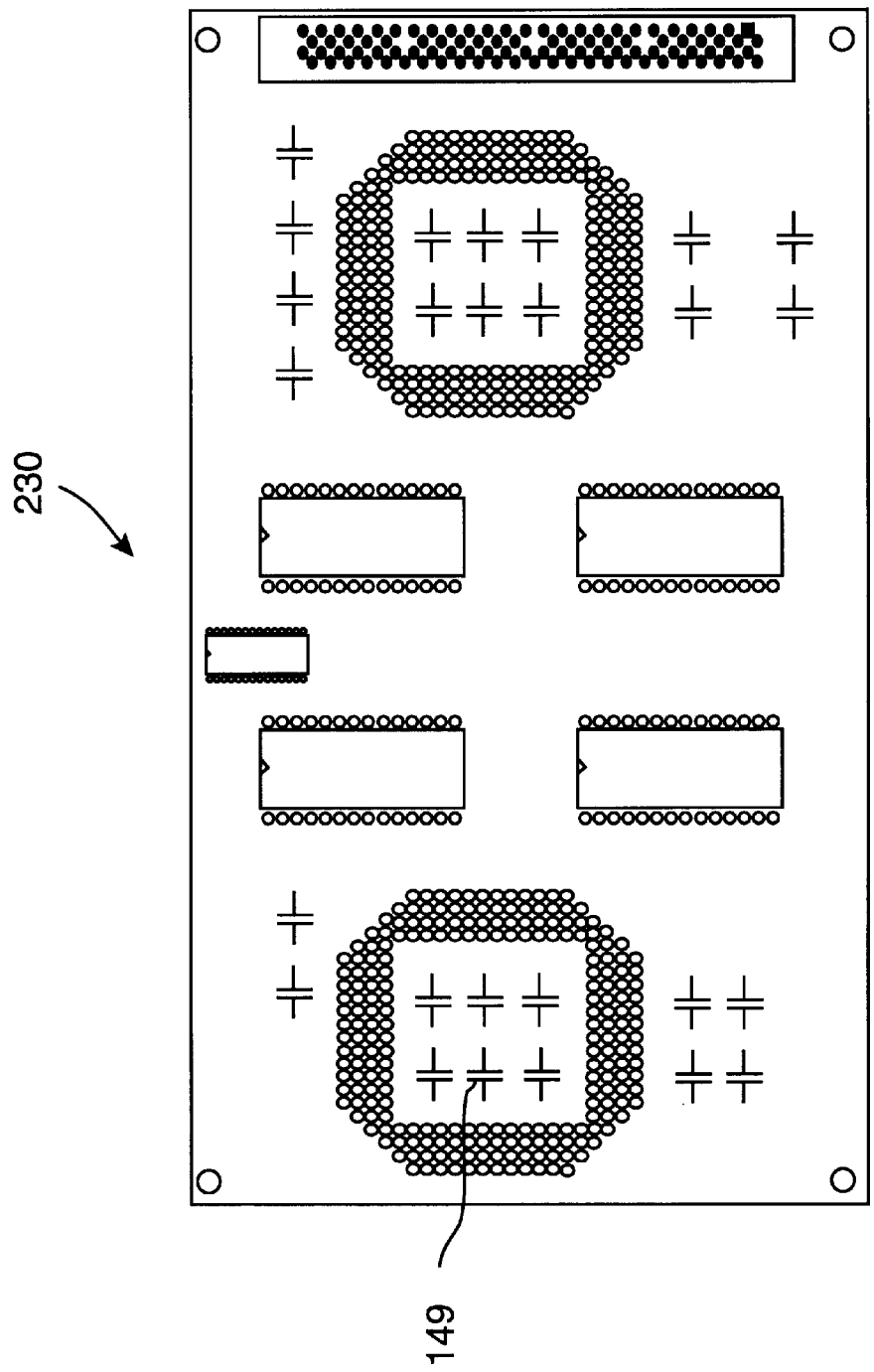
FIG. 5 is a diagrammatic bottom view of a production version printed circuit board that corresponds to the test printed circuit board shown in FIGS. 3 and 4.

When this approach is taken, the device under test can readily be prepared for testing by simply exposing the die and running a ribbon cable between the printed circuit board connector 143 and the matching connector on the main board. The exposed dies can then be tested and debugged as necessary. When the debugging is complete, it may be desirable to eliminate the openings 145 from the production models of the printed circuit board. In such cases, the portion of the production printed circuit board real estate that corresponds to the positions that the openings 145 were located becomes available for use. In some embodiments it may be desirable to leave that portion of the printed circuit board blank and without having any traces pass therethrough. On the other hand, in many (probably most) situations, board space is in relatively short supply. In such cases it may be desirable to reroute some of the traces and alter the position of some of the surface mounted components on the production board to utilize the recovered board space. By way of example, it may be desirable to design the production board 230 so that just a few simple surface mounted components 149 (such as the capacitors shown in FIG. 5) are located in the space designated for openings 145 in the test board. Those few component can then be moved to another convenient location such as the periphery of the prototype test board 130 as can be seen by comparing FIG. 4 to FIG. 5. In the embodiment shown, the surface mounted components (capacitors in the illustrated embodiment) that are to be positioned in the production board space corresponding to openings 145 are mounted near the periphery of the prototype board 130. This minimizes the impact of moving the placement of those components since in many production boards, it is desirable to leave a margin around the edges of the boards to facilitate handling.

In another embodiment, the prototype board 330 may not be specially designed.

Thus, when opening(s) 145 are cut, several traces will likely be cut. In this case, jumpers are provided to duplicate the wiring that is severed by cutting openings.

Although only one embodiment of the present invention has been described, it should be understood that the present invention may be embodied in many other specific forms without departing from the spirit or scope of the invention. Particularly, the invention may be applied to virtually any type of electronic module. In addition to the computer system motherboard and plug in boards discussed above, modules for controllers and virtually any other type of electronic device can be tested in the same manner. Further, although the invention has been described in conjunction with the use of printed circuit boards as the substrate that supports the integrated circuits under test as well as other component, the invention may be used in conjunction with other substrates as well.

As pointed out in the specification, one of the most common type of testing that can benefit from use of the present invention is mechanical probing. However, the invention is equally applicable to a variety of other types of testing including emissions microscopy, heat sensing, e-beam probing, voltage contrast testing using a scanning electron microscope, etc.

Further it should be appreciated that the described invention is not limited to system and module level testing, although those are two preferred embodiments. However, it should be appreciated that dedicate testers, such as integrated mechanical die prober testers can be adapted to operate in accordance with the present invention. Therefore, the present examples are to be considered as illustrative and not restrictive, and the invention is not to be limited to the details given herein, but may be modified within the scope of the appended claims.

What is claimed is:

1. A method of testing an integrated circuit in a system level environment using an actual electrical system in which the integrated circuit is intended to be used to operate the integrated circuit during the testing, the integrated circuit being part of a module which makes up part of the electrical system and the integrated circuit to be tested being operatively connected to the electrical system when the testing occurs, the method comprising the steps of:

exposing a die in a packaged integrated circuit to be tested;

placing the module that incorporates the exposed die on a test platform and positioning a sensor probe relative to the exposed die such that the sensor probe can directly monitor the die during testing;

operating the electrical system in a manner which exercises the exposed die; and using the sensor probe to directly monitor the die while the exposed die is being exercised by the operation of the electrical system in which the integrated circuit is intended to be used.

2. A method as recited in claim 1 wherein the exposed die is packaged using ceramic packaging and the die is exposed by removing a package cover.

3. A method as recited in claim 1 wherein the die is packaged using a plastic packaging material that encapsulates the die and the die is exposed by etching portions of the plastic packaging material.

4. A method as recited in claim 1 wherein the sensor probe is positioned relative to the exposed die by moving the test platform.

5. A method as recited in claim 1 wherein the sensor probe is positioned relative to the exposed die by moving the sensor probe.

6. A method as recited in claim 1 wherein the module is a main board in a computer system.

7. A method as recited in claim 1 wherein the module has a first connector that is arranged to plug into a second connector in the system and the method further comprises the step of wiring the first connector to the second connector to electrically couple the module into the system.

8. A method as recited in claim 7 wherein the second connector is located on a main board in a computer system.

9. A method as recited in claim 1 wherein the sensor probe is a sub-micron probe of a mechanical die prober and the sub-micron probe monitors actual conductors on the die during die probing testing.

10. A method as recited in claim 9 wherein the mechanical die prober is arranged to force signals onto the conductors of the die through the sub-micron probe.

11. A method as recited in claim 1 wherein the sensor probe is an emissions microscope and the testing is emissions testing.

12. A method as recited in claim 1 wherein the sensor probe is an infra-red (IR) camera and the testing is heat sensing.

13. A method as recited in claim 1 wherein the sensor probe is an electron-beam prober.

14. An integrated circuit tester comprising:

a test platform arranged to support a board level module that carries a multiplicity of electrically connected components that make up at least a part of an overall electrical system in which the integrated circuit is intended to be used, the platform supporting the board level module such that the board level module remains operatively connected to the electrical system during the testing procedure;

a probe for directly interrogating a designated exposed integrated circuit die that is mounted on and electrically connected within said module and which forms a component in the electrical system; and a driver suitable for directing the operation of the electrical system in which the integrated circuit die is intended to be used in a manner that exercises the designated die to facilitate testing of the designated die during the operation of the electrical system.

15. An integrated circuit tester as recited in claim 14 wherein the probe is a mechanical die prober.

16. An integrated circuit tester as recited in claim 14 wherein the probe is an emissions microscope.

17. An integrated circuit tester as recited in claim 14 wherein the probe is an infra-red camera.

18. A module suitable for testing, the module comprising:

a printed circuit board suitable for supporting a multiplicity of components, the printed circuit board including a multiplicity of traces for electrically connecting various components, the printed circuit board having a prober testing opening formed therein; and a multiplicity of components mounted on the printed circuit board, the multiplicity of components including an integrated circuit on a silicon die that is mounted over the prober testing opening such that a sensor probe can access the die through said prober testing opening when the die is exposed and while the die is still electrically connected to the module.

19. A board level device as recited in claim 18 further comprising a socket for supporting the integrated circuit, the socket including a central opening positioned over the prober testing opening such that the sensor probe can access the die through said central opening when the die is exposed.

20. A board level device as recited in claim 19 wherein the integrated circuit is a cavity down, leads down integrated circuit.

21. A board level device as recited in claim 18 wherein the traces are routed around the prober testing opening.

* * * * *